United States Patent [19]

Jones

[11] 4,361,066

[45] Nov. 30, 1982

[54] TEMPO MEASUREMENT, DISPLAY, AND CONTROL SYSTEM FOR AN ELECTRONIC MUSICAL INSTRUMENT

[75] Inventor: Edward M. Jones, Cincinnati, Ohio

[73] Assignee: Baldwin Piano & Organ Company, Cincinnati, Ohio

[21] Appl. No.: 273,788

[22] Filed: Jun. 15, 1981

[51] Int. Cl.[3] .......................... G10F 1/00; G01R 23/00

[52] U.S. Cl. .............................. 84/1.03; 84/DIG. 12; 364/484; 307/269

[58] Field of Search ...................... 84/1.03, 1.13, 1.26, 84/DIG. 12, 484; 328/77, 78; 307/269; 364/481, 483, 484, 486

[56] References Cited

U.S. PATENT DOCUMENTS

| | | | |
|---|---|---|---|
| 4,089,246 | 5/1978 | Kooker | 84/1.03 |
| 4,292,874 | 10/1981 | Jones et al. | 84/1.03 |
| 4,299,154 | 11/1981 | Dietrich et al. | 84/1.03 |

*Primary Examiner*—B. Dobeck
*Assistant Examiner*—Forester W. Isen
*Attorney, Agent, or Firm*—Kirkland & Ellis

[57] ABSTRACT

The present invention provides a system in an electronic musical instrument for measuring the setting of a variable resistor for controlling tempo, displaying the tempo to which the setting corresponds, and controlling the tempo so that notes are sounded in accordance with the setting measured and displayed. The tempo control comprises a tempo potentiometer that is self-calibrating by means of a microprocessor which automatically measures the resistance of both the current setting of the tempo potentiometer and the maximum setting of the potentiometer so as to maintain the desired correspondence between the mechanical position of the tempo potentiometer and the tempo selected. A non-linear relationship is introduced between the mechanical position of the tempo potentiometer and the tempo selected in order to maintain a desirable correspondence between the mechanical position of the tempo potentiometer and the tempo selected. An alternative embodiment of the present invention provides means for calibrating two potentiometers.

8 Claims, 4 Drawing Figures

TEMPO MEASUREMENT, DISPLAY, AND CONTROL SYSTEM FOR AN ELECTRONIC MUSICAL INSTRUMENT

BACKGROUND OF THE INVENTION

1. Field of the Invention

The present invention relates to apparatus for measuring and displaying the tempo corresponding to the setting of a manually adjustable tempo control, and for controlling the tempo rate in an electronic musical instrument in response to the setting of the manual control by the musician, and more specifically to a tempo control that is self-calibrating and which has a non-linear relationship between the mechanical position of the manual control and the tempo selected.

2. Description of the Prior Art

Metronomes providing audible beats corresponding to a particular time signature or tempo rate are well-known in the art. As noted in the co-pending U.S. patent application Ser. No. 143,269 entitled "Rhythm Rate and Tempo Monitor for Electronic Musical Instruments Having Automatic Rhythm Accompaniment," filed Apr. 24, 1980, and which is the parent of continuation application Ser. No. 345,798, filed Feb. 4, 1982, titled "Rhythm Rate and Tempo Monitor for Electronic Musical Instruments having Automatic Rhythm Accompaniment" and assigned to the same assignee as the instant application and assigned to the Baldwin Piano & Organ Company, such prior art devices have ranged from simple mechanical devices to more elaborate electronic systems. It is also noted that some prior art metronome devices included visible indicators for augmenting the audible beats. The foregoing patent application describes a microprocessor based system for monitoring tempo rate in an electronic musical instrument of the type having means for automatically producing a preselected rhythm accompaniment having a desired tempo, such as that described and illustrated in U.S. Pat. No. Re. 29,144.

In a first mode of operation the system described in the foregoing patent application permits the musician to adjust the rhythm rate of a rhythm accompaniment unit visually by a digital display of quarter notes per minute in the absence of an audible rhythm output. In a second mode of operation the foregoing system can be used with the rhythm unit on as a timing indicator for player synchronization with rhythm. In this second mode of operation, the timing indicator appears on a display consisting of four adjacent numeric character indicators. The down-beat indication is displayed as a numeric 1 in the left-most display device, the second beat is displayed in the adjacent display device as numeric 2, etc., so that the effect of motion is imparted to the display. Processing circuitry automatically interprets the time signature of the rhythm accompaniment produced by the rhythm accompaniment unit to provide the proper number of beats displayed as numeric characters per display sequence.

In the foregoing patent application the rhythm rate and tempo monitor system is implemented by a microprocessor. The tempo rate is determined by the setting of a rate potentiometer which determines the charging time of an associated capacitor. Initially, the microprocessor, by executing appropriate instructions stored in an internal ROM, discharges the capacitor and begins a counting loop. The count accumulated during the charging time provides a measure of the resistive setting of the rate potentiometer, and consequently the tempo rate of the rhythm accompaniment unit. When the rhythm unit is off, the count obtained from the rhythm potentiometer setting is converted to a tempo,rate number by means of a look-up table contained within the microprocessor ROM. This number is then displayed on the numeric character display as the appropriate number of quarter notes per minute. When the rhythm unit is on, a clock pulse, related to the rhythm potentiometer setting, is gated to the rhythm unit. The clock pulse operates an address counter which is used to generate the rhythm pattern. Using the address outputs from the address counter, the microprocessor sequentially displays the appropriate numeric character in the proper display device. In one embodiment, the displays are blanked between successive character displays to provide a scanned timing indicator.

The present invention, on the other hand, provides improved means for accomplishing the features of the foregoing system. Specifically, the prior art rhythm rate and tempo monitor system does not include means for compensating for inaccuracies or drift in the values of the capacitor and rate potentiometer. Another feature of the prior art system is that to allow for drift in the resistance of the potentiometer, considerable dead space must be provided near the maximum setting of the potentiometer to ensure that a reading corresponding to the maximum tempo rate is always obtained. This dead space is undesirable because the musician operating the instrument expects to obtain a maximum reading near the maximum position of the potentiometer. In addition, the present invention provides means for introducing a non-linear relationship between capacitor charging time and the time interval between rhythm beats. This is done so that the steps in the rate displayed are finer in the middle of the range of potentiometer settings than near the two extreme potentiometer settings. Thus, settings in the range most frequently selected by the musician can be selected with the greatest accuracy.

SUMMARY OF THE INVENTION

The tempo of the rhythm in an electronic musical instrument is controlled by a potentiometer. A visual readout of the tempo corresponding to the setting of the potentiometer is provided by a digital display. When the rhythm is not running, the tempo is displayed numerically by numbers ranging from 40 to 360. The numbers displayed indicate the number of quarter notes being sounded per minute. The decimal point on the display is flashed on every quarter note so that it is on for an eighth note and off for an eighth note. When the rhythm is running the display numbers, 1, 2, 3, and 4 flash in the respective digit positions of the display during each measure. Each digit is on for an eighth note with no digit being on for the next eighth note so that the digits flash with every quarter note, and move from left to right on the display.

In the present invention, each step in the display of quarter notes per minute represents an approximately equal rotation of the potentiometer. The steps in the rhythm rate as the musician operates the tempo potentiometer are 40, 45, 50,–175, 180, 190,–230, 240, 260, 280, 300, 320, and 360. Also, with the present invention, the percentage change of each step is caused to be less in the middle of the tempo potentiometer range than near the ends since the middle range is used more often.

The setting of the tempo potentiometer is read in a linear manner by timing the discharge of a capacitor, with the discharge rate being controlled by the resistance of the potentiometer (i.e., by the setting of the tempo potentiometer). The measurement of the pulse width is obtained by keeping a transistor controlled by the microprocessor in the "on" condition so that one portion of the potentiometer is shorted out and the other portion acts as a variable resistor. To obtain the reading, a 27-microsecond, negative pulse is supplied by a microprocessor to produce a sawtooth wave, the slope of which is inversely proportional to the potentiometer resistance. This causes a second transistor, the base of which is connected to the foregoing sawtooth signal, to be cut off for a period of time inversely proportional to the slope of the sawtooth signal, which is determined by the potentiometer resistance (i.e., to the setting of the tempo potentiometer), and a positive pulse to be supplied via the second transistor to the external interrupt terminal of the microprocessor during the time that the second transistor is cut off.

In a first variation, the end of the pulse applied to the external interrupt terminal produces an interrupt which stops the incrementing of an accumulator within the processor so that the final accumulator value represents the pulse width (i.e., with a resolution of a few microseconds). A second variation for measuring pulse width is available with microprocessors having a "pulse width mode" feature. This feature permits the width of a pulse at the external interrupt terminal to be interrogated directly to the nearest microsecond, without actually creating an interrupt. The timer decrements every microsecond until the pulse on the external interrupt terminal ends. The pulse width is determined by interrogating the timer 253 microseconds after the 27-microsecond pulse has ended (i.e., 253 microseconds after the beginning of the pulse applied to the external interrupt terminal). A third variation for measuring the pulse width uses external circuitry in a conventional manner.

The present invention also performs a calibration to ensure that the maximum tempo reading will be displayed when the potentiometer is set to its maximum setting, thereby eliminating any dead space near the maximum potentiometer setting. The calibration also ensures that predetermined tempos are selected by generally equal changes in the position of the tempo control (e.g., each step in tempo corresponds to an equal degree of rotation of the tempo control potentiometer). The calibration method also obviates the need for manufacturing and service adjustments to correct for inaccuracies or drift in component values. This is accomplished by taking, in addition to the foregoing pulse width measurement, a calibration measurement of the pulse width which results with the entire resistance of the potentiometer in the circuit. A computation is made by the microprocessor using both the first and second measurements of pulse width so that the tempo selected by a particular setting of the tempo control is not affected by moderate changes in the resistance of the potentiometer.

The rhythm rate set by the potentiometer is measured by the present invention and converted to a binary number or count which controls the automatic rhythm rate. The timing of the beats within each measure is thereby controlled by the setting of the tempo potentiometer.

In an alternative embodiment of the present invention, two or more potentiometers can be read and separate self-calibration provided for each. Thus, the calibration described above is performed on two potentiometers. The potentiometers can be used to control other characteristics of the music being produced in addition to tempo.

DETAILED DESCRIPTION OF THE PREFERRED EMBODIMENT

Figure 1:
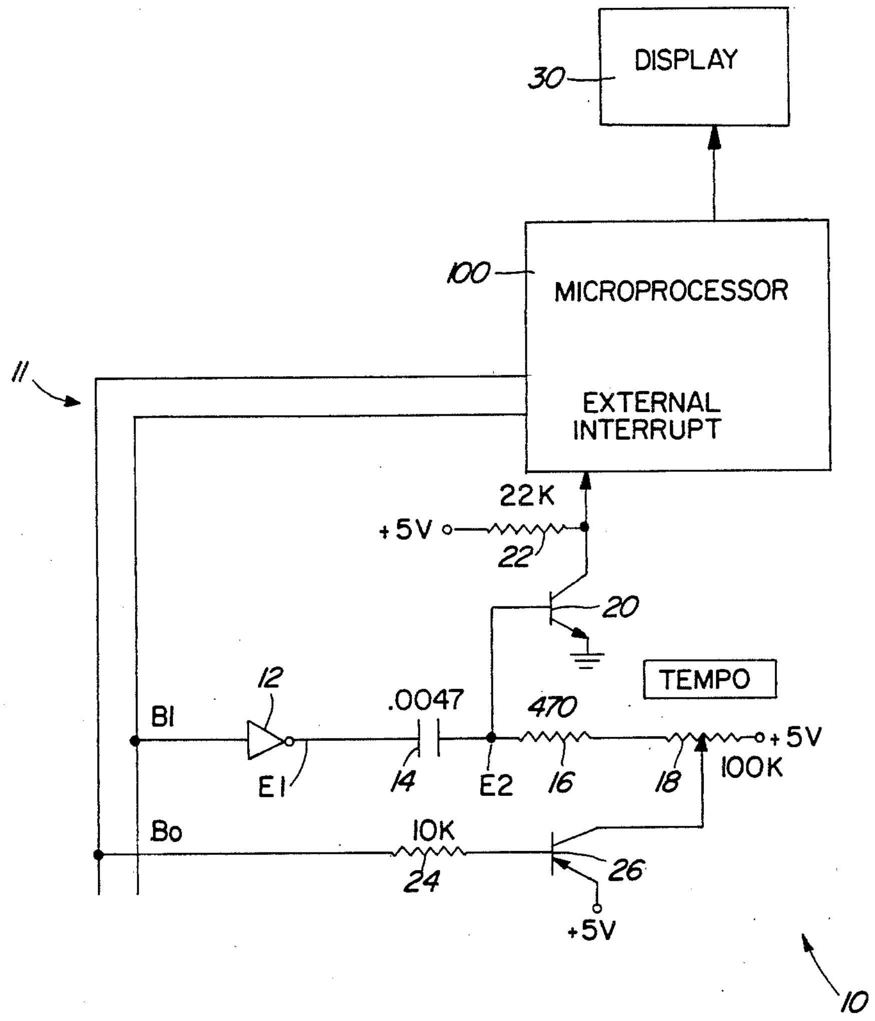
FIG. 1 is a circuit diagram illustrating the circuitry for measuring the setting of the tempo potentiometer.

The circuitry for determining the tempo rate selected by the musician by setting the tempo potentiometer is illustrated in FIG. 1 Tempo rate is set by adjusting tempo potentiometer 18. As illustrated in FIG. 1, a communication bus 11 connects the bits B0 and B1 from port 5 of a microprocessor 100 to a resistor 24 and inverter 12, respectively. A capacitor 14 is connected from the output of inverter 12 to the base of transistor 20, which is an NPN transistor. The base of transistor 20 is also connected through a resistor 16 in series with the fixed resistance of the tempo potentiometer 18 to a supply voltage of +5 volts. The emitter of transistor 20 is connected to ground and the collector of transistor 20 is connected to the external interrupt terminal of microprocessor 100. The collector of the transistor 20 also is connected through resistor 22 to the supply voltage of +5 volts. Bit B0 from the communication bus 11 is connected through resistor 24 to the base of transistor 26, which is a PNP transistor. The emitter of transistor 26 is connected to a supply voltage of +5 volts and the collector of transistor 26 is connected to the variable resistor portion of tempo potentiometer 18.

The method for reading the position of tempo potentiometer 18 in a linear manner (i.e., in a manner in which the reading is linearly related to the setting of the tempo potentiometer) is to time the discharge of capacitor 14, with the discharge rate being controlled by the variable resistance of tempo potentiometer 18. A pulse width corresponding to the discharge time of the capacitor 14 is measured by keeping bit B0 low, which causes transistor 26 to be turned on. When transistor 26 is on, the right-hand portion of the potentiometer 18 is shorted out, and the left-hand portion acts as a variable resistor as illustrated in FIG. 1. A 27-microsecond negative pulse is supplied by bit B1 from port 5, which is inverted by inverter 12 to produce a positive pulse at E1. The positive pulse at E1 is applied to capacitor 14 thereby producing a sawtooth at E2 having a slope inversely proportional to the potentiometer resistance. The charge on capacitor 14 discharges through resistor 16 and tempo potentiometer 18 until the voltage at E2 reaches +0.7 volts, which causes transistor 20 to turn on. Consequently, transistor 20 is cut off for a time proportional to the potentiometer resistance. While transistor 20 is cut off, the +5 volt source is connected via resistor 20 to the external interrupt terminal of microprocessor 100. Thus, a positive pulse having a width equal to the time transistor 20 is cut off is applied to the external interrupt terminal of microprocessor 100.

In the commercially available type 3870 or 3872 microprocessors, a special "pulse width mode" is provided. This pulse width mode permits the width of a pulse at the external interrupt terminal to be interrogated directly to the nearest microsecond, without actually creating an "interrupt" of the microprocessor's operations. In accordance with a program of instructions stored in a ROM, the microprocessor interrogates a timer 253 microseconds after the leading edge of the positive pulse is applied to the external interrupt terminal (i.e., 253 microseconds after the end of the 27-microsecond negative pulse supplied by bit B1). The timer decrements every microsecond while a pulse is applied on the external interrupt terminal. By interrogating the timer after the termination of the pulse on the external interrupt terminal, the pulse width ("PW") is determined. In the pulse width mode, 253 microseconds is the maximum pulse width that can be measured and, if the pulse width exceeds 253 microseconds, 253 is recorded by the microprocessor. However, in the present invention the circuit component values are chosen so that generally the maximum pulse width is less than 253 microseconds.

Another method for measuring the pulse width is to count the number of passes through a program loop, which loop of instructions continues to be executed while the pulse is applied to the external interrupt terminal, as described in the above-referenced, co-pending application Ser. No. 143,269 entitled "Rhythm Rate and Tempo Monitor for Electronic Musical Instruments Having Automatic Rhythm Accompaniment," assigned to Baldwin Piano & Organ Company. The pulse is then determined by counting the number of passes through the program loop. A third method of measuring pulse width is to use conventional external circuitry.

The present invention provides means for making calibration measurements and for using such measurements to compensate for component value inaccuracies and drift which may occur over the instrument's expected lifetime. The calibration measurement measures the pulse width which results when the entire resistance of tempo potentiometer 18 is in the circuit. Without such a calibration, it is found that considerable dead space must be provided at the maximum setting of tempo potentiometer 18 in order to ensure that the maximum pulse width, which converts to the maximum tempo of 360 quarter notes per minute, will be obtained. The dead space is necessary so that the maximum tempo of 360 is obtained even when considerable drift occurs in the resistance of the tempo potentiometer 18 (i.e., which may occur over the expected lifetime of the instrument). Furthermore, a musician normally expects the 360 maximum tempo to be near the maximum position of tempo potentiometer 18.

With reference to FIG. 1, the calibration measurement is made by setting bit B0 of microprocessor 100 to the high state and applying bit B0 through resistor 24 to the base of transistor 26 (type PNP), thereby causing transistor 26 to be cut off while B0 is high. This causes the entire resistance of tempo potentiometer 18 to be in the circuit. As a result, when the maximum pulse width ("PWM") measurement is made, in a manner analogous to that described above for measuring PW, the voltage on capacitor 14 charges through the entire resistance of tempo potentiometer 18, instead of through the variable resistor portion of tempo potentiometer 18, which occurs when transistor 26 is on, as described above.

The microprocessor then performs the computation $R1=40(PW+1)/(PWM-1)$, with any fractional remainder being disregarded, whereby an integer less than or equal to 40 is obtained. R1 is the count, ranging from 0 to 40, corresponding to the current setting of tempo potentiometer 18 and to a predetermined tempo. The +1 and −1 in the foregoing calculation assures that if the potentiometer is at the maximum, the tempo will be the maximum value of 360, even though the readings are several milliseconds apart and there may be 60 cycle interference. At the other extreme of rotation, the resistance of the variable portion of tempo potentiometer 18 plus the resistance of resistor 16 are sufficiently low to always result in a pulse width PW small enough so that R1 is equal to zero.

In the preferred embodiment, the nominal value of the pulse width at the maximum setting of tempo potentiometer 18 is PWM=140. With the present method, if the resistance of tempo potentiometer 18 or the capacitance of capacitor 14 changes so that PWM is as high as 253 or as low as 80, there is no degradation of performance. Thus, since R1 is determined approximately by the ratio of PW/PWM, the absolute values of PW and PWM do not affect the count R1. In other words, even if the values of capacitor 14 and potentiometer 18 change moderately and thereby affect the absolute values of PW and PWM, since PW and PWM are affected proportionately, their ratio remains relatively constant.

As a result, the count R1 and the predetermined tempo to which a particular position of potentiometer 18 corresponds is not affected by moderate changes in component values. If the maximum setting of tempo potentiometer 18 produces a pulse width greater than 253 microseconds, PWM will stay at 253 as noted above, the only disadvantage being the existance of some dead space at the maximum setting of the potentiometer. If PWM becomes less than 80, the positional steps between different tempo settings of tempo potentiometer 18 may become irratic, some tempo settings may be skipped, and there may be instances in which the tempo displayed by display 30 alternates between two values because the amount of backlash introduced, as hereinafter described, would not be sufficient to prevent such alternation.

In the preferred embodiment, a pulse width measurement is made as described above at regular intervals, e.g., every 10.4 milliseconds. Because the measurements alternate between PW and PWM, the entire cycle of measurement and computation of count R1 occurs once every 20.8 milliseconds. After each measurement the microprocessor resets its internal timer for normal operation, where it decrements every 50 microseconds instead of every microsecond, as it does while operating in the pulse width mode.

Figure 4:
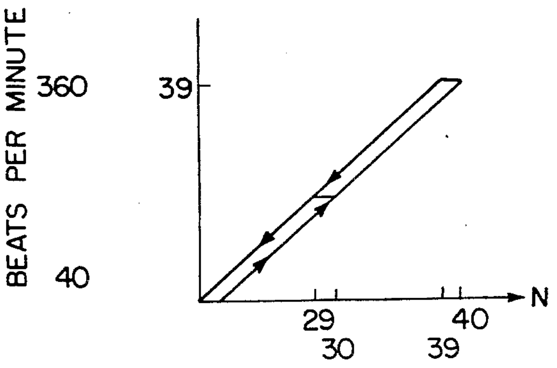
FIG. 4 is a plot illustrating the "backlash" provided to the tempo control by the present invention.

The present invention also provides a method and apparatus for providing backlash to prevent two adjacent readings from alternating if the potentiometer 18 is on a borderline setting. Such alternating between values is undesirable since it affects both the tempo displayed on display 30 and the tempo being sounded by the instrument. To prevent this occurrence, the count R1 obtained by the above-described calculation is compared with the value of N, where N is equal to the value of count R1 for the previous measurements and calculation. If R1 is less than or equal to N, N is set equal to count R1. Consequently, N can always be pulled down as low as count R1 goes (i.e., to as low as 0 at the minimum setting of tempo potentiometer 18). If count R1 is greater than the previous value of N, N is set equal to R1−1 (N lags one behind as the setting of tempo potentiometer 18 is increased, and as a result N seldom has a value higher than 39). Therefore, if count R1 were to oscillate between two adjacent values, N would remain constant at the lower value, as illustrated in FIG. 4.

Figure 2:
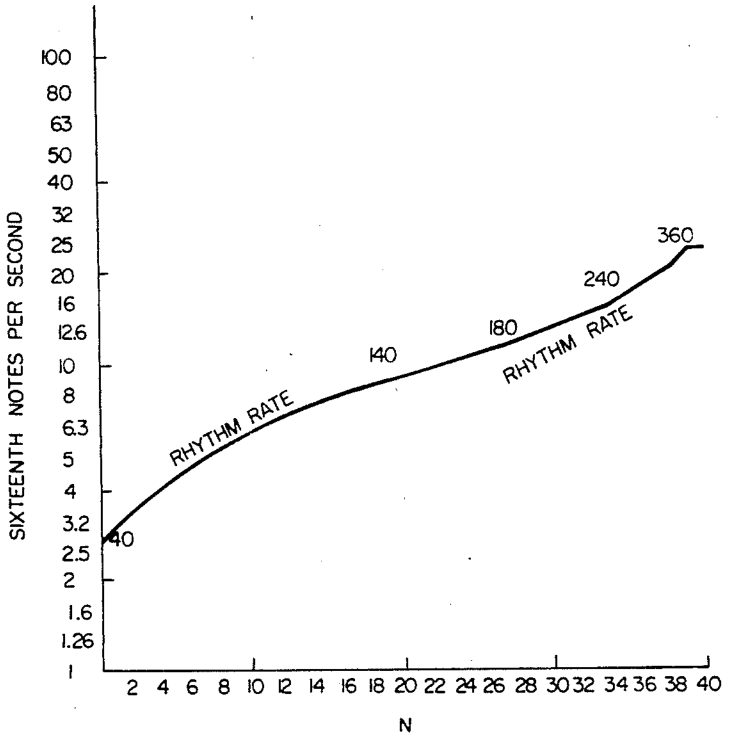
FIG. 2 is a plot of rhythm rate and pulse width.

A quantity RR (i.e., rhythm rate) is then computed from N by a nonliner method. When multiplied by 5, RR gives the desired 40 different predetermined rhythm rates which are displayed by display 30 in a manner known in the art. Thus, RR is equal to N+8 if N is less than 29; RR is equal to 2N−20 if N is greater than 28 and less than 35; RR is equal to 4N−88 if N is greater than 34 and less than 39; and RR is equal to 72 if N is equal to 39 or 40. Thus, a non-linear relationship is introduced between the charging time of the capacitor 14 and the time interval between rhythm beats, as illustrated in FIG. 2. An alternative method of obtaining a nonlinear relationship is to use a look-up table of RR values stored in a memory of the microprocessor. For at least a part of the range of values of N, corresponding RR values are looked up by the microprocessor, i.e., the look-up table is interrogated by the microprocessor. After the non-linear value RR is obtained, which is linearly related to the desired tempo (i.e., rhythm rate), then the actual interval between the rhythm rates is determined by using RR to decrement the number RT in a rhythm timer register, which number RT controls the actual rhythm rate. That is, when the rhythm is on, the number RT determines when beats occur. When the rhythm is off, the number RT times the flashing of the decimal point on the display 30. The rhythm beats always occur at intervals of the interrupt period, which is 5.2 milliseconds, but by using the rhythm timer register method the rhythm rate averages accurately to the displayed rate.

As noted above, RT is decremented by the value of RR every 5.2 milliseconds. When RT becomes negative, the number 192 is added to it and a rhythm counter RX is advanced. Each such addition of 192 represents an interval of 1/48th of a measure. Thus, RX counts 1/48th notes, which facilitates timing both 1/12th and 1/16th notes. 1/48th notes occur (RR/192) 60/0.0052=60 RR times per minute, which is the quantity displayed by display 30. Based on the foregoing, quarter notes occur 5 RR times per minute. In the preferred embodiment, RX is sometimes advanced by two, and takes on the values 0, 1, 2, 4, 5, 6, 8, 9, 10, 12, etc. Bits B7 through B2 of register RX count sixteenth notes, bits B7 and B6 of register RX count measures, with the sequence of RX values being repeated every four measures.

Figure 3:
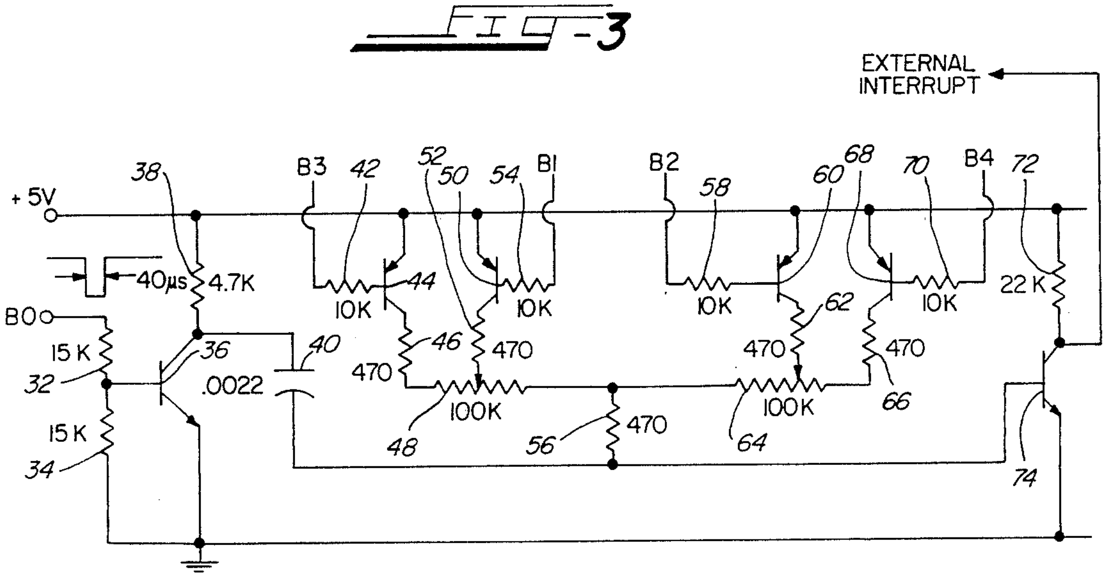
FIG. 3 is a schematic diagram illustrating the circuitry for measuring the setting of two potentiometers and for providing self-calibration of each of them.

An alternative embodiment of the present invention is illustrated in FIG. 3. This alternative embodiment is a circuit for measuring the setting of two potentiometers 48 and 64 and providing calibration for each. Bits B0, B1, B2, B3, and B4 are provided by microprocessor 100 via communication bus 11. Table 1 shows the state of bits B0 through B4 applied by microprocessor 100 to read the setting of potentiometer 48, to calibrate potentiometer 48, to read the setting of potentiometer 64, and to calibrate potentiometer 64.

TABLE 1

| | (Initial Pulse) B0 | B3 | B1 | B2 | B4 |
|---|---|---|---|---|---|
| CALIBRATE POTENTIOMETER 48 | L | L | H | H | H |
| READ POTENTIOMETER 48 | L | L | L | H | H |
| CALIBRATE POTENTIOMETER 64 | L | H | H | H | L |
| READ POTENTIOMETER 64 | L | H | H | L | L |

The operation of the circuit in FIG. 3 is similar to the operation of circuit 10 in FIG. 1. Thus, to read potentiometer 48, bit B3 is low causing transistor 44 (PNP type) to be on, bit B1 is also low causing transistor 50 (PNP type) to be on, bit B2 is high causing transistor 60 (PNP type) to be cut off, and bit B4 is high causing transistor 68 (PNP type) to be cut off. Since transistors 44 and 50 are both on, only the variable portion of the resistance of potentiometer 48 is in the circuit, the remaining fixed portion being shorted out. Since transistors 60 and 68 are both off, potentiometer 64 is not in the circuit during the reading of potentiometer 48.

A negative pulse having a width of 40 microseconds is applied to bit B0 causing transistor 36 (NPN type) to be cut off. With transistor 36 off, capacitor 40 is charged through resistor 58 toward +5 volts causing transistor 74 to remain on until the end of the 40 microsecond pulse. A sawtooth voltage is produced at the base of transistor 74 having a slope inversely proportional to the potentiometer resistance being measured. The charge on capacitor 40 discharges through resistor 56, the potentiometer 48, and resistor 52 until the voltage on the base of transistor 74 reaches +0.7 volt, at which time transistor 74 turns on. Consequently, transistor 74 is cut off for a time linearly related to the resistance of potentiometer 48. While transistor 74 is cut off, the +5 volt source is connected via resistor 72 to the external interrupt terminal of microprocessor 100. Thus, a positive pulse having a width equal to the time transistor 74 is cut off and directly proportional to the resistance of potentiometer 48 is applied to the external interrupt terminal of microprocessor 100. The measurement of this pulse width is accomplished by one of the three methods described above with respect to circuit 10.

Measuring the setting of the resistance of potentiometer 64 is carried out in the same manner as for potentiometer 48. To measure the resistance of potentiometer 64, however, bits B1 and B3 are high so that transistors 44 and 50 are cut off, while bits B2 and B4 are low so that transistors 60 and 68 are on. This causes the fixed resistance portion of potentiometer 64 to be shorted out. Capacitor 40 in this case discharges through resistor 56, the potentiometer 64, the resistor 62 until the voltage on the base of transistor 74 reaches +0.7 volt. Thus, a positive pulse having a pulse width equal to the time transistor 74 is cut off and directly proportional to the resistance of potentiometer 64 is applied to the external interrupt terminal of microprocessor 100. This pulse width is measured as described above.

Calibration of the potentiometers 48 and 64 also is accomplished in a manner similar to that used to calibrate tempo potentiometer 18 in circuit 10. Thus, to calibrate potentiometer 48, bit B3 is low and bits B1, B2, and B4 are high, thereby causing transistor 44 to be on and transistors 50, 60, and 68 to be off. Bit B0 is low for 40 microseconds causing capacitor 40 to charge toward +5 volts in the same way as when readings of the potentiometers are made. Since only transistor 44 is on, however, during the calibration reading capacitor 40 discharges through resistor 56, the maximum resistance of potentiometer 48, resistor 46 and transistor 44. A pulse is produced on the external interrupt terminal having a width directly proportional to the maximum resistance of potentiometer 48. The calibration reading for potentiometer 64 is made in a completely analogous manner to the calibration reading for potentiometer 48 just described.

Resistors 46, 52, 62, and 66 are not essential to the operation of the circuit and could be omitted. However, since the transistors are usually connected to the potentiometers through several feet of wire, these resistors protect the transistors from burn out due to lightning or static electric discharges that could be coupled into these wires.

While the preferred embodiment of the invention has been illustrated and described, it is to be understood that the invention is not limited to the precise construction herein disclosed, and the right is reserved to all changes and modifications coming within the scope of the invention as defined in the appended claims.

I claim:

1. In an electronic musical instrument having means for automatically producing a preselected rhythm accompaniment having a desired tempo, tempo control apparatus having a tempo control for setting the desired tempo, said apparatus comprising:

capacitor means;

variable resistor means for determining a sampling pulse width corresponding to the desired tempo, said variable resistor means being connected between said capacitor means and a source of voltage, said variable resistor means also being adjustable by the tempo control;

means for causing said capacitor means to begin charging at a rate determined by the setting of said variable resistor means;

pulse width measuring means for measuring the period of time after said capacitor means begins charging at the rate determined by the setting of said variable resistor means until the voltage on said capacitor means reaches a predetermined value;

means for causing said capacitor means to begin charging at a rate determined by the maximum setting of said variable resistor means;

maximum pulse width measuring means for measuring the period of time after said capacitor means begins charging at the rate determined by the maximum setting of said variable resistor means until the voltage on said capacitor means reaches a predetermined value; and digital data processing means for processing the measurements made by said pulse width measuring means and said maximum pulse width measuring means and producing a count corresponding to the setting of said variable resistor means, wherein the count produced corresponds to a ratio including both measurements.

2. The apparatus as claimed in claim 1 wherein the predetermined tempos selected by said tempo control are not separated by equal changes in tempo.

3. The apparatus as claimed in claim 2 wherein each change in the count produced by said digital processing means corresponds to an equal change in the setting of said variable resistance means.

4. The apparatus as claimed in claim 1 wherein the count produced by said digital processing means is compared with the preceding count produced during the preceding calculation by said digital processing means and decreased by one if the preceding count is less than the count, whereby backlash is provided.

5. The apparatus as claimed in claim 1 wherein the count produced by said digital processing means is compared with the preceding count produced during the preceding calculation by said digital processing means and increased by one if the preceding count is more than the count, whereby backlash is provided.

6. The apparatus as claimed in claim 1 wherein said digital data processing means produces a rhythm rate non-linearly related to the count, which rhythm rate determines the tempo at which notes are sounded on the electronic musical instrument, wherein said digital processing means decrements by the rhythm rate a rhythm timer register at regular intervals, wherein when the number in said rhythm timer register becomes negative said rhythm timer register is incremented by a predetermined amount by said digital data processing means, and wherein each time said rhythm timer register is incremented corresponds to an equal fractional portion of a measure.

7. The apparatus as claimed in claim 6 wherein said rhythm rate is calculated from said count by means of a nonlinear calculation by said digital data processing means.

8. The apparatus as claimed in claim 6 wherein said rhythm rate is calculated from said count by means of a lookup table that is interrogated by said digital data processing means.

* * * * *

UNITED STATES PATENT AND TRADEMARK OFFICE

CERTIFICATE OF CORRECTION

PATENT NO. : 4,361,066

DATED : November 30, 1982

INVENTOR(S) : Edward M. Jones

It is certified that error appears in the above-identified patent and that said Letters Patent are hereby corrected as shown below:

In the Abstract, line 13, "non-linear" should be --nonlinear--.

Col. 1, line 14, "non-linear" should be --nonlinear--.

Col. 2, line 53, "numbers," should be --numbers--.

Col. 2, line 64, "-175" should be --... 175--.

Col. 2, line 64, "-230" should be --... 230--.

Col. 4, line 67, "20" should be --22--.

Col. 7, line 10, "nonliner" should be --nonlinear--.

Col. 7, line 18, "non-linear" should be --nonlinear--.

Col. 7, line 28, "non-linear" should be --nonlinear--.

Col. 8, line 53, "the resistor" should be --and resistor--.

Col. 10, line 31, "non-linearly" should be --nonlinearly--.

Signed and Sealed this

*Twenty-second* Day of *March 1983*

[SEAL]

*Attest:*

GERALD J. MOSSINGHOFF

*Attesting Officer* *Commissioner of Patents and Trademarks*